(12) United States Patent
Hashimoto et al.

(10) Patent No.: US 6,787,412 B2
(45) Date of Patent: Sep. 7, 2004

(54) DIELECTRIC ELEMENT AND METHOD FOR FABRICATING THE SAME

(75) Inventors: Akira Hashimoto, Kanagawa-ken (JP); Yoshimi Sato, Kanagawa-ken (JP); Atsushi Kawakami, Kanagawa-ken (JP); Hideya Kobari, Kanagawa-ken (JP); Tetsuya Nakajima, Kanagawa-ken (JP)

(73) Assignee: Tokyo Ohka Kogyo Co., Ltd., Kanagawa-ken (JP)

( * ) Notice: Subject to any disclaimer, the term of this patent is extended or adjusted under 35 U.S.C. 154(b) by 36 days.

(21) Appl. No.: 10/458,199

(22) Filed: Jun. 11, 2003

(65) Prior Publication Data
US 2003/0209747 A1 Nov. 13, 2003

Related U.S. Application Data

(62) Division of application No. 09/709,423, filed on Nov. 13, 2000, now Pat. No. 6,597,027.

(30) Foreign Application Priority Data

Nov. 11, 1999 (JP) .......................................... 11-321303

(51) Int. Cl.$^7$ .......................................... H01L 21/8242
(52) U.S. Cl. ...................... 438/239; 438/240; 438/957
(58) Field of Search ................................. 438/239, 240, 438/957, 3

(56) References Cited

U.S. PATENT DOCUMENTS

| 5,994,153 A | 11/1999 | Nagel et al. |
| 6,162,293 A | 12/2000 | Kijima et al. |
| 6,323,081 B1 | 11/2001 | Marsh |

FOREIGN PATENT DOCUMENTS

| JP | 10-335588 | 12/1998 |
| KR | 1999-27044 | 4/1999 |

Primary Examiner—George Fourson
Assistant Examiner—Thanh V Pham
(74) Attorney, Agent, or Firm—Wenderoth,Lind&Ponack, LLP

(57) ABSTRACT

It is disclosed a dielectric element comprising a lower electrode, a dielectric layer, and an upper electrode which are provided on a substrate, in which at least one of the electrodes is a Pt layer, a Ru layer is used as a base layer for the Pt layer. In the fabrication of the dielectric element, the Pt layer is formed by electroplating, a photoresist pattern is used as a plating mask, and an Ru layer is formed as a seed layer. The present invention makes it possible to provide a dielectric element using Pt as an electrode material, that is capable of easily forming a Pt electrode having excellent electrical characteristics without generating voids or seams, that is capable of forming a fine pattern, and that does not occur contamination in a processing chamber, and a method for fabricating a dielectric element of having the characteristics mentioned above.

7 Claims, 5 Drawing Sheets

DIELECTRIC ELEMENT AND METHOD FOR FABRICATING THE SAME

This is a divisional of Ser. No. 09/709,423, filed Nov. 13, 2000 now U.S. Pat No. 6,597,027.

BACKGROUND OF THE INVENTION

1. Field of the Invention

The present invention relates to a dielectric element having a lower electrode, a dielectric layer, and an upper electrode in which Pt is used as an electrode material, and a method for fabricating such a dielectric element.

2. Description of Relevant Art

In recent years, attempts have been made actively to apply a dielectric element fabricated by using a high dielectric material such as BTO, STO or BST, or by using a ferroelectric material such as SBT, SBTN or PZT to a nextgeneration highly integrated DRAM or non-volatile memory.

Each of the aforementioned dielectric materials is made of plural metal oxides. Since a process for forming a dielectric layer is performed in an oxidative atmosphere, it is desirable to use a conductive material as an electrode material for a dielectric element that is not likely to be oxidized, or exhibits a conductivity even when it is oxidized.

Those conductive materials include metals such as Pt, Ir, Ru, Rh, Re, Os, and Au, and oxides thereof. Above all, a dielectric element using Pt as an electrode material has been attracting attention due to the excellent conductivity, the heat and chemical stability, the ability to form a high dielectric thin film or a ferroelectric thin film with a desirable orientation controllability, etc.

In order to increase the degree of integration of IC circuits, it will be desired in the future to micro-process dielectric elements on the order of about 0.5 $\mu$m or less, particularly about 0.2 $\mu$m or less. However, the mass-production processing limit, i. e., etching performance, of a Pt electrode is about 0.8 $\mu$m at present, and the electrode after the processing is likely to have a tapered or trapezoidal shape. Thus, an increase in the degree of integration of IC circuits using Pt still has problems to be solved.

Moreover, since it is difficult to perform etching Pt by a chemical reaction with a halogen gas, Pt is generally processed physically by a sputtering method and the like. However, the damage caused to a dielectric layer during such a physical processing method deteriorates electrical characteristics of the dielectric element.

Furthermore, it takes a long time to process Pt, and Pt residues generated during the processing may be adhered to an inner wall of a processing chamber, thereby causing contamination. Therefore, it is necessary to clean the inside of the processing chamber and an etcher every time when the processing is completed of several wafers.

Reports on Pt electrode materials in dielectric elements have been made in various articles. "Monthly Semiconductor World" (November, 1998, pp. 62–67) discloses a semiconductor element where BST, a high dielectric material, is used as a dielectric layer, and Pt is used as an electrode material. It also describes that as Pt is mostly processed by physical sputtering method, an etched-away residue or product may be adhered to the processed Pt electrode surface, or a Pt electrode may have a tapered shape, thereby making it difficult to form a fine pattern.

"Monthly Semiconductor World" (July, 1999, pp. 30–34) teaches a method of forming Pt lower electrode in a contact hole on a substrate by electroplating, where an Ru layer is provided as an electroplating seed layer onto an entire inner surface of the contact hole, and an $SiO_2$ film is used as a plating mask layer, in the fabrication of a dielectric element having a self-aligned stacked (SAS) capacitor structure using BST, a high dielectric material, as a dielectric layer.

In such a case, however, the Pt plated layer grows not only from the Ru layer on the bottom surface of the contact hole, but also from the Ru layer on the inner side surface of the contact hole. Therefore, a coarse plated layer having voids or seams may be resulted.

Furthermore, the $SiO_2$ film used as the plating mask should be dry-etched and removed by using a strong acid fluorine-based gas such as $CF_4$, $CHF_3$, or $C_2F_6$. Therefore, during the etching process, an insulating film, generally an $SiO_2$ layer, on the substrate will also be stripped away.

In order to avoid such a problem, a wet etching or removing method using an HF solution may be used. However, the removal effect thereof is smaller than that of by the dry etching method, and the wet etching method has the problem of a particle generation. Also, the Ru seed layer cannot be removed by the HF solution. Therefore, after the $SiO_2$ film as a mask is removed by the HF solution, the Ru seed layer needs to be separately removed by dry etching. Thus, the wet etching method has a poor production efficiency.

Unexamined Published Japanese Patent Application (Kokai) No. 335588/1998 discloses a method for fabricating a ferroelectric element having a structure where a ferroelectric substance is interposed between electrodes containing a noble metal as its main component, wherein a base layer such as Pd, Ni, Ti, or TiN that catalyzes the plating of the noble metal is firstly formed, and then the noble metal is deposited onto the base layer by a plating method to form an electrode. However, it has problems that each of the aforementioned materials for the base layer loses its conductivity when oxidized by a heat treatment in the oxygen atmosphere, thereby deteriorating the conductivity of the electrode. Moreover, it is difficult to remove the base layer made of each of the said materials by etching, and the material etched away may contaminate the inside of the processing chamber.

SUMMARY OF THE INVENTION

An object of the present invention is to provide a dielectric element using Pt as an electrode material, that is capable of easily forming a Pt electrode having excellent electrical characteristics without generating voids or seams, that is capable of forming a fine pattern, and that does not occur contamination in a processing chamber.

Another object of the present invention is to provide a method for fabricating a dielectric element of having the characteristics mentioned above.

As a result of intensive studies made in order to solve the above-described problems, the present inventors found out that, in the formation of a Pt electrode by electroplating, the prior art problem occurred by the use of said strong acid material for removing a mask can be solved by using a photoresist layer instead of the $SiO_2$ layer as a mask for electroplating, that is capable of being removed by an oxygen plasma treatment.

Moreover, the present inventors found out that the prior art problem of contamination occurred in the processing chamber during the removal of the seed layer can be solved by using an Ru material, as a seed layer for forming a Pt plated layer, whose oxide exhibits a conductivity and can be easily removed by an oxygen plasma treatment.

Furthermore, the present inventors found out that the prior art problem caused by using an $SiO_2$ film as a mask, and by forming an Ru layer on an entire inner surface of a contact hole as a seed layer, can be solved by forming a photoresist pattern onto an Ru layer over a substrate as a plating mask, and by performing Pt electroplating onto an exposed area of the Ru layer where no mask pattern is formed.

Thus, the present invention provides a dielectric element formed by sequentially depositing on a substrate an Ru layer, a Pt layer, a dielectric layer which is a ferroelectric layer, and a Pt layer (hereinafter, referred to as a "first dielectric element").

The present invention also provides a method for fabricating a dielectric element (hereinafter, referred to as a "first dielectric element fabrication method") which comprises:

(I) forming an Ru layer on a substrate;

(II) forming a photoresist layer on the Ru layer;

(III) selectively exposing the photoresist layer, and forming a photoresist pattern as a mask on the Ru layer;

(IV) forming a Pt layer, which is to be a lower electrode, on an exposed or unmasked area of the Ru layer by electroplating using a Pt plating solution utilizing the Ru layer as an electroplating electrode;

(V) removing the photoresist pattern and the Ru layer provided thereunder;

(VI) forming a dielectric layer on the Pt layer; and (VII) forming a conductive layer, which is to be an upper electrode, on the dielectric layer.

The present invention also provides a dielectric element formed by sequentially depositing on a substrate a Pt layer, a dielectric layer, an Ru layer, and a Pt layer (hereinafter, referred to as a "second dielectric element").

The present invention also provides a method for fabricating a dielectric element (hereinafter, referred to as a "second dielectric element fabrication method") which comprises:

(I) forming a conductive layer, which is to be a lower electrode, on a substrate;

(II) forming a dielectric layer on the conductive layer;

(III) forming an Ru layer on the dielectric layer;

(IV) forming a photoresist layer on the Ru layer;

(v) selectively exposing the photoresist layer, and forming a photoresist pattern as a mask on the Ru layer;

(VI) forming a Pt layer, which is to be an upper electrode, on an exposed or unmasked area of the Ru layer by electroplating using a Pt plating solution utilizing the Ru layer as an electroplating electrode; and (VII) removing the photoresist pattern and the Ru layer provided thereunder.

The present invention also provides a dielectric element formed by sequentially depositing on a substrate an Ru layer, a Pt layer, a dielectric layer, an Ru layer, and a Pt layer (hereinafter, referred to as a "third dielectric element").

The present invention also provides a method for fabricating a dielectric element (hereinafter, referred to as a "third dielectric element fabrication method") which comprises:

(I) forming an Ru layer on a substrate;

(II) forming a photoresist layer on the Ru layer;

(III) selectively exposing the photoresist layer, and forming a photoresist pattern as a mask on the Ru layer;

(IV) forming a Pt layer, which is to be a lower electrode, on an exposed or unmasked area of the Ru layer by electroplating using a Pt plating solution utilizing the Ru layer as an electroplating electrode;

(V) removing the photoresist pattern and the Ru layer provided thereunder;

(VI) forming a dielectric layer on the Pt layer;

(VII) forming an Ru layer on the dielectric layer;

(VIII) forming a photoresist layer on the Ru layer;

(IX) selectively exposing the photoresist layer, and forming a photoresist pattern as a mask on the Ru layer;

(X) forming a Pt layer, which is to be an upper electrode, on an exposed or unmasked area of the Ru layer by electroplating using a Pt plating solution utilizing the Ru layer as an electroplating electrode; and (XI) removing the photoresist pattern and the Ru layer provided thereunder.

DETAILED DESCRIPTION OF THE INVENTION

Figure 1:
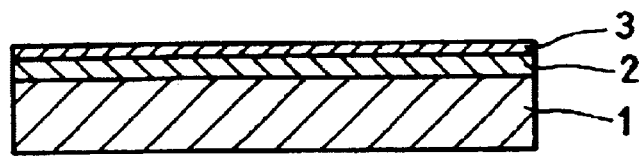
FIG. 1 is a schematic cross-sectional view illustrating a step in a method for fabricating a dielectric element according to an example of the present invention.

The present invention will be specifically described below.

The "first dielectric element" of the present invention is a dielectric element formed by sequentially depositing on a substrate an Ru layer, a Pt layer (a lower electrode), a dielectric layer, and a Pt layer (an upper electrode) on a substrate, wherein the dielectric layer is a ferroelectric layer.

Examples of a material for forming the ferroelectric layer used in the first dielectric element include those containing lead containing compounds such as PZT, PLZT and PLZTN, and those containing bismuth (Bi) layered compounds such as SBT and SBTN.

Particularly, a material for forming a Bi-based ferroelectric layer containing a Bi layered compound has been attracting public attention as a material for semiconductor memories and sensors because it has advantageous characteristics such as requiring small coercive field in remanent polarization P-E hysteresis curve and hence experiencing less fatigue as a result of repeated polarization switching.

Preferred examples of the material for forming a Bi-based ferroelectric layer include those containing a Bi alkoxide, an A metal alkoxide, where A represents at least one metallic element selected from the group consisting of Bi, Pb, Ba, Sr, Ca, Na, K, and rare earth metallic elements, and a B metal alkoxide, where B represents at least one metallic element selected from the group consisting of Ti, Nb, Ta, W, Mo, Fe, Co, and Cr.

Preferred materials for forming a Bi-based ferroelectric layer are those forming a ferroelectric layer containing a Bi layered compound represented by the following general formula (I):

$$(Bi_2O_2)^{2+}(A_{m-1}B_mO_{3m+1})^{2-} \quad (I)$$

where A represents at least one metallic element selected from the group consisting of Bi, Pb, Ba, Sr, Ca, Na, K, and rare earth metallic elements; B represents at least one metallic element selected from the group consisting of Ti, Nb, Ta, W, Mo, Fe, Co, and Cr; and m is an integer of 1–5.

Among these, particularly preferred materials for forming a ferroelectric layer are those such that the above-described Bi-based ferroelectric layer contains a Bi layered compound represented by the following general formula (II):

$$Sr_{1-x}Bi_{2+y}(Ta_{2-z}Nb_z)O_{9+\alpha} \quad (II)$$

where $0 \leq x$, y and $\alpha$, independently $<1$ ; $0 \leq z < 2$.

In the present invention, it is particularly preferred that at least two different metal alkoxides selected from the group consisting of the A metal alkoxide, the B metal alkoxide, and the Bi alkoxide form a composite metal alkoxide. By forming a composite material from two or more different metal alkoxides, it is possible to inhibit separation (segregation) of a single metallic element and burnout thereof. Therefore, it is possible to inhibit the generation of a leakage current more effectively.

The metal alkoxides contained in the aforesaid materials for forming a Bi-based ferroelectric layer are exemplified as the following specific embodiments (a)–(e):

(a) A—Bi composite metal alkoxide and B metal alkoxide;

(b) Bi—B composite metal alkoxide and A metal alkoxide;

(c) A—B composite metal alkoxide and Bi metal alkoxide;

(d) A—Bi—B composite metal alkoxide; and (e) A metal alkoxide, B metal alkoxide, and Bi alkoxide.

The composite metal alkoxide as used hereabove is a compound obtainable by reacting different metal alkoxides within a solvent at a temperature in a range from 20 to 100° C. for about 2 to 15 hours. Toward the end point of reaction, the liquid is gradually discolored to finally become a dark brown liquid. A point in time when the liquid has been discolored completely may be regarded as the end point of the reaction. The thus obtained composite metal alkoxide is considered to be one defined in the "Manufacturing Method of Glass Ceramics by Sol-Gel Process and Applications" (Applied Tech. Pub. Co., Jun. 4, 1989), pp.46–47, and to be expressed specifically by: $ABi(OR^1)_k(OR^2)_3$, $BBi(OR^3)_n(OR^2)_3$, $AB(OR^1)_k(OR^3)_n$, $ABBi(OR^1)_k(OR^3)_n(OR^2)_3$, where A and B are as defined hereabove; k is a valency of metallic element A; n is a valency of metallic element B; and $R^1$, $R^2$, and $R^3$ respectively represent alkyl groups having 1–6 carbon atoms independently of each other. Among these, it is preferable to use $ABi(OR^1)_k(OR^2)_3$, $BBi(OR^3)_n(OR^2)_3$, or $ABBi(OR^1)_k(OR^3)_n(OR^2)_3$, which is a composite compound of Bi said to have a high sublimation, i.e., the above-described embodiment (a), (b), or (d).

In the present invention, the aforesaid material for forming a Bi-based ferroelectric layer is preferably a sol-gel liquid obtained through hydrolysis and partial polycondensation using water alone, or water and a catalyst.

Further, the material for forming a Bi-based ferroelectric layer preferably contains a product obtainable by reacting the above-described composite metal alkoxide with at least one compound (stabilizer) selected from the group consisting of carboxylic anhydrides, dicarboxylic acid mono-esters, β-diketones, and glycols.

Both of the hydrolysis and partial polycondensation and the reaction with the stabilizer may be used.

More specifically, preferred examples include:

(1) an embodiment where the material for forming a Bi-based ferroelectric layer is subjected to the hydrolysis and partial polycondensation using water alone, or water and a catalyst to obtain a sol-gel liquid;

(2) an embodiment where the material for forming a Bi-based ferroelectric layer is subjected to the hydrolysis and partial polycondensation using water alone, or water and a catalyst to obtain a sol-gel liquid, and then a stabilizer is added thereto to react with the composite metal alkoxide in the liquid;

(3) an embodiment where the composite metal alkoxide is reacted with the stabilizer; and (4) an embodiment where the composite metal alkoxide in the material for forming a Bi-based ferroelectric layer is reacted with the stabilizer, and then the material for forming a Bi-based ferroelectric layer is subjected to the hydrolysis and partial polycondensation using water alone, or water and a catalyst to obtain a sol-gel liquid.

The aforementioned stabilizer is used for improving the preservation stability of the coating solution, and particularly used for inhibiting the thickening and gelling of the coating solution after it is subjected to the hydrolysis process. Each of the stabilizers mentioned above is preferably one with a short chain having 1–6 carbon atoms in view of improving the polarity of the metallic compound and enhancing its inorganic properties after the application. Lower monocarboxylic acids such as acetic acid, propionic acid, butyric acid, and valeric acid can be used as stabilizers if desired.

In the case where the material for forming a Bi-based ferroelectric layer is subjected to hydrolysis and partial polycondensation, the hydrolysis and partial polycondensation reactions are conducted by adding water alone, or water and a catalyst into the coating solution, and then stirred at 20 to 50° C. for several hours to several days. Any catalysts such as metal alkoxides that are known in the art of hydrolysis may be employed and exemplary catalysts include acid catalysts such as inorganic acids including, for example, hydrochloric acid, sulfuric acid and nitric acid; and organic acids such as acetic acid, propionic acid and butyric acid; and inorganic or organic alkali catalysts such as sodium hydroxide, potassium hydroxide, ammonia, monoethanolamine, diethanolamine, and tetramethylammonium hydroxide. Among these, acid catalysts are particularly preferable in view of the properties of the formed film.

The composite metal alkoxide is reacted with a stabilizer as described above for carboxylation, β-diketonization, chelation, etc., so that it is possible to obtain a product (organometallic compound) having a polarity and an excellent stability. Moreover, the hydrolyzability thereof is improved, and practical application of a polar solvent can be realized. Consequently, it is possible to sufficiently facilitate the condensation polymerization reaction by the sol-gel process in the coating solution. Furthermore, by the generation of an inorganic bond (methalloxane bond) such as Bi—O—Bi, Bi—O—Ta, Bi—O—Sr, or Ta—O—Bi—O—Sr, it is possible to reduce the separation (segregation) and burnout amounts of a specific metallic element such as Bi, and to enhance the inorganicity of the coating solution.

Examples of solvents for the coating solution for forming a Bi-based ferroelectric layer include saturated aliphatic solvents, aromatic solvents, alcoholic solvents, glycol-based solvents, ether-based solvents, ketone-based solvents, and ester-based solvents. Among these, alcoholic solvents, glycol-based solvents, ether-based solvents, ketone-based solvents, and ester-based solvents, which have oxygen atoms in the molecules, are preferably used when hydrolysis type sol-gel liquids are prepared.

The ferroelectric layer can be formed by using known application method such as an LSMCD (=liquid source misted chemical deposition) method, a spinner method, or a dip method. The thickness of the ferroelectric layer is preferably in a range from about 40 to 300 nm.

The Ru layer is preferably made of Ru and/or an Ru oxide ($RuO_x$). More specifically, the Ru layer is preferably one selected from a layer made of Ru, a layer made of $RuO_x$, a layer containing Ru and $RuO_x$, and a layer formed by sequentially depositing the layer made of Ru and the layer made of $RuO_x$.

The method for forming the Ru layer is not limited to any particular method. The Ru layer can be formed by various methods including an electroless plating method, a sputtering method, a vapor deposition method, a CVD method, and a coating method. The thickness of the Ru layer is preferably in a range from about 10 to 500 nm in view of the conductivity, the processing cost, the micro-processing, and the like.

Pt forming the lower electrode and the upper electrode has an excellent conductivity, and heat and chemical stability. Moreover, when a high dielectric layer or a ferroelectric layer is used as a dielectric layer, it is possible to form a dielectric substance with a desirable orientation controllability. Therefore, a dense ferroelectric layer with an excellent orientation controllability can be obtained in the present invention. In the first dielectric element, although the method for forming the Pt layer is not limited to any particular method, the Pt layer is preferably formed by electroplating using a Pt plating solution. The thickness of each of the lower electrode and the upper electrode is preferably in a range from about 50 to 300 nm.

In the first dielectric element, the Ru layer is provided as a base layer of the Pt layer which serves as the lower electrode. Therefore, when the Pt layer is formed by electroplating, the Ru layer can function as a seed layer for forming a Pt plated layer as Ru and $RuO_x$, are conductive materials. Furthermore, as the Ru layer becomes volatile $RuO_4$ (melting point: 25° C., boiling point: 40° C.) by an oxygen-containing plasma treatment at a temperature of 108° C. or higher, the inside of the processing chamber is not contaminated by residues, during removing it.

The Ru layer remained under the Pt electrode functions as an electrode material together with the Pt electrode, thereby making it possible to improve the electrical characteristics of the dielectric element.

The "first dielectric element fabrication method" of the present invention comprises:

(I) forming an Ru layer on a substrate;

(II) forming a photoresist layer on the Ru layer;

(III) selectively exposing the photoresist layer, and forming a photoresist pattern as a mask on the Ru layer;

(IV) forming a Pt layer, which is to be a lower electrode, on an exposed or unmasked of the Ru layer by electroplating using a Pt plating solution utilizing the Ru layer as an electroplating electrode;

(V) removing the photoresist pattern and the Ru layer provided thereunder;

(VI) forming a dielectric layer on the Pt layer; and (VII) forming a conductive layer, which is to be an upper electrode, on the dielectric layer.

The formation of the Ru layer in the above-described step (I) can be performed by the same material and method as those described above in the description of the "first dielectric element".

The formation of the photoresist layer in the above-described step (II) can be performed, for example, by applying a photoresist composition used for fabricating a printed board, a semiconductor integrated circuit, etc., on the Ru layer, and drying the photoresist composition.

Generally known photoresist compositions include those that can form pattern of a positive image or a negative image after a development process by irradiation of radiations or electron beams. If the irradiated portion of a photoresist composition becomes soluble in a developing solution and a positive image is thus provided, such a composition is referred to as a positive photoresist composition. If the irradiated portion of a photoresist composition becomes insoluble in a developing solution and a negative image is thus provided, such a composition is referred to as a negative photoresist composition.

Also known are photoresist compositions which can form a photoresist pattern, without performing the development process, by using radiation or electron beam irradiation to decompose and remove the irradiated portion. It is possible to employ such compositions in the present invention.

When forming a photoresist layer in the "first fabrication method" of the present invention, it is possible to employ any one of the aforementioned photoresist compositions. However, it is desirable that the photoresist composition has a sufficient resistance against the plating solution, and can form a minute pattern on the order of 0.5 μm or less with a good reproducibility. A positive photoresist composition containing novolac resin and a quinone diazide group containing compound is preferably used as such a photoresist composition.

Upon forming the photoresist pattern in the above-described step (III), the exposure conditions can be suitably selected according to a photoresist used. The exposure is performed by exposing the photoresist layer through a desired mask pattern using, for example, a light source which emits active beams such as ultraviolet rays, far ultraviolet rays, excimer laser, X-rays, and electron beams (e.g., a low-pressure mercury lamp, a high-pressure mercury lamp, an extra-high pressure mercury lamp, a xenon lamp, etc.), or by scanning the photoresist layer with electron beams. Thereafter, post-exposure bake is conducted as needed.

In the case of using a photoresist that requires a development for forming a pattern after the exposure, the development is not limited to any particular method. For example, it is possible to conduct a dip development in which a substrate with a photoresist coated thereon is dipped in a developing solution for a certain period of time, and then the substrate is washed with water and dried; a paddle development in which a developing solution is dripped onto the surface of the applied photoresist and left standing for a certain period of time, and the photoresist is washed with water and dried; a spray development in which a developing solution is sprayed to the surface of the photoresist, and the photoresist is washed with water and dried; or the like. A desired photoresist pattern can thusly be formed.

In the above-described step (IV), the Pt layer which is to be a lower electrode is formed by the electroplating process using a Pt plating solution on the area of the Ru layer which is not masked by the photoresist pattern formed in step (III).

The unmasked Ru layer is used as an electroplating electrode (seed layer).

As the Pt plating solution, "Platanex 3LS" (product of Electroplating Engineers of Japan, Ltd.) which is a strong acid Pt plating solution of pH of about 1, for example, can be used.

The formation of the Pt lower electrode using the electroplating method can be performed by making the substrate in contact with the Pt plating solution for about 1 to 20 minutes utilizing the Ru layer as the electroplating electrode under such conditions that the current density is $1 \times 10^5$ $A/m^2 (=1A/dcm^2)$ and the Pt plating solution bath temperature is in a range from about 70 to 90° C.

As the electroplating apparatus, an apparatus as described in "Monthly Semiconductor World" (January, 1998, pp. 58–63) can be used.

By forming the Pt lower electrode by electroplating, the step of etching the Pt electrode can be omitted. Therefore, the problem caused by the etching processing is solved, and the formation of a minute pattern, a reduction in a damage to the dielectric layer, and an improved production efficiency are realized. Furthermore, as two steps, i.e., the step of forming the lower electrode and the step of etching processing, can be replaced by one plating step, the present invention has an excellent mass-productivity.

Moreover, since the Ru layer becomes volatile $RuO_4$ by an oxygen-containing plasma treatment at a temperature of 108° C. or higher, the photoresist layer and the Ru layer forming the base layer of the photoresist layer can be simultaneously removed easily without contaminating the inside of the processing chamber. Since the Ru layer remained under the Pt electrode functions as an electrode material together with the Pt electrode, the electrical characteristics of the dielectric element can be improved.

Furthermore, unlike the conventional example in which the Ru layer is formed on the entire inner surface of the contact hole using an $SiO_2$ film as a plating mask to form the Pt plated layer in the contact hole, it becomes possible to selectively deposit the plating onto the Ru layer provided on the substrate precisely in accordance with the mask pattern by forming the photoresist pattern which functions as an electroplating mask on the Ru layer provided on the substrate. Thus, it is possible to solve the problem in the prior art that a coarse plated layer having voids or seams is likely to be obtained.

In the above-described step (V), examples of the method for removing the photoresist pattern and the Ru layer provided thereunder include a wet removing method using a stripping solution, a dry removing method using an oxygen-containing plasma treatment, and the like. In the present invention, it is preferable to use the dry removing method as the simultaneous removal of the photoresist layer and the Ru layer provided thereunder can simplify the fabrication steps. The dry removal method is preferably conducted using an oxygen-containing plasma at a temperature of 108° C. or higher, particularly in a range from 108 to 450° C., in consideration of the removal of the Ru layer as the base layer. Since the Ru layer becomes volatile $RuO_4$ under such a condition, it is possible to easily remove the photoresist layer and the Ru layer provided thereunder together without contaminating the inside of the processing chamber.

In the above-described step (VI) of the fabrication method of the present invention, a high dielectric material such as STO or BST, or a ferroelectric material such as SBT or PZT can be preferably used for the dielectric layer, and the Bi-based ferroelectric described in the description of the "first dielectric element" is particularly preferred to use for the dielectric layer, although materials for the dielectric layer are not limited thereto. The dielectric layer can be formed by using a known application method such as an LSMCD method, a spinner method, or a dip method.

In the above-described step (VII), the conductive layer which is to be an upper electrode is formed on the dielectric layer. According to the first fabrication method of the present invention, a material for the upper electrode is not limited to any particular material as long as it is a conductive material which is rarely oxidized, or a material which exhibits a conductivity even when oxidized.

Examples of such conductive materials include metals such as Pt, Ir, Ru, Rh, Re, Os, and Au, and oxides thereof. Among these, Pt is preferable to use due to its excellent conductivity and heat and chemical stability. Moreover, Pt is preferably used in a dielectric element which employs a BST-based high dielectric film, or PZT or SBT-based ferroelectric film since it can form such a dielectric film with an excellent orientation controllability.

The electrode can be formed by using various methods such as a sputtering method, a vapor deposition method, a CVD method, a coating method, and an electroplating method utilizing these electrode materials as above. In the case where Pt is used as the material for the upper electrode, the electrode may be preferably formed by an electroplating method. The electroplating method used in such a case may be the same method as that used when forming the lower electrode (Pt).

It is desirable to perform a heat treatment after the formation of the upper electrode to improve the contact property (conductivity) between the dielectric layer and the upper electrode.

Due to this heat treatment, crystal grains are grown, and the interface between the dielectric thin film and the upper electrode is stabilized, thereby improving electrical characteristics of the dielectric element.

The heat treatment is preferably performed in a temperature range of less than 900° C., and more particularly in a temperature range from about 400 to 800° C. If the treatment temperature is less than 400° C., it is difficult to sufficiently improve the aforementioned contact property even if the heat treatment is performed for a long time. If the treatment temperature is equal to or higher than 900° C., the influence of the degradation in the element characteristics due to the heat is increased. Therefore, the treatment temperature of less than 400° C. and that of 900° C. or higher are not preferable. The heating time is preferably in a range from about 10 to 60 minutes. The heat treatment atmosphere may be either the oxygen atmosphere or the inert gas atmosphere.

The "second dielectric element" of the present invention is a dielectric element formed by sequentially depositing on a substrate a Pt layer (lower electrode), a dielectric layer, an Ru layer, and a Pt layer (upper electrode).

The Ru layer, the Pt layer, and methods for forming these layers may be the same as those described in the description of the "first dielectric element".

A high dielectric material such as STO or BST, or a ferroelectric material such as SBT or PZT can be preferably used as the dielectric layer, although materials for the dielectric layer are not limited thereto. The Bi-based ferroelectric same as that used in the "first dielectric element" is particularly preferable to use. The dielectric layer can be formed by using a known application method such as an LSMCD method, a spinner method, or a dip method.

In the "second dielectric element", the upper electrode (Pt layer) is not directly formed on the dielectric layer, but the upper electrode is deposited on the dielectric layer via the Ru layer. In the prior art where the upper electrode is directly formed onto the dielectric layer using, e.g., a sputtering method, a vapor deposition method, or a CVD method, a degradation in the dielectric characteristics occurs due to the reduction of the dielectric layer. In the present invention, however, as the Pt layer (upper electrode) is deposited via the Ru layer over the dielectric layer, the said degradation phenomenon can be inhibited.

Moreover, since the Ru layer is formed as a base layer for the Pt layer (upper electrode), in the case where the Pt layer is formed by electroplating, the Ru layer can function as a seed layer for forming a Pt plated layer. As the Ru layer becomes volatile $RuO_4$ by an oxygen-containing plasma treatment at a temperature of 108° C. or higher, the inside of the processing chamber is not contaminated by residues, or the like, during removing it.

Furthermore, the Ru layer functions as an electrode material together with the Pt electrode, thereby making it possible to improve the electrical characteristics of the dielectric element.

The "second dielectric element fabrication method" comprises:

(I) forming a conductive layer, which is to be a lower electrode, on a substrate;

(II) forming a dielectric layer on the conductive layer;

(III) forming an Ru layer on the dielectric layer;

(IV) forming a photoresist layer on the Ru layer;

(V) selectively exposing the photoresist layer, and forming a photoresist pattern as a mask on the Ru layer;

(VI) forming a Pt layer, which is to be an upper electrode, on an exposed or unmasked area of the Ru layer by electroplating using a Pt plating solution utilizing the Ru layer as an electroplating electrode; and (VII) removing the photoresist pattern and the Ru layer provided thereunder.

In the second dielectric element fabrication method, any material can be used as long as it is a conductive material which is rarely oxidized, or a material which exhibits a conductivity even when oxidized.

Examples of such conductive materials include metals such as Pt, Ir, Ru, Rh, Re, Os and Au, and oxides thereof. Among these, Pt is preferable to use due to its excellent conductivity and heat and chemical stability. Moreover, Pt is preferably used in a dielectric element which employs a BST-based high dielectric film, or PZT or SBT-based ferroelectric film since it can form such a dielectric film with an excellent orientation controllability.

The electrode can be formed by using various methods such as a sputtering method, a vapor deposition method, a CVD method, a coating method, and an electroplating method utilizing the above-mentioned electrode materials. In the case where Pt is used as the material for the lower electrode, the electrode is preferably formed by an electroplating method. The electroplating method used in such a case may be the same as that used when forming the lower electrode (Pt) described in the description of the "first dielectric element fabrication method".

It is desirable to perform a heat treatment after the formation of the lower electrode to improve the contact property (conductivity) between the Ru layer, which is the base layer, and the lower electrode.

Unlike the conventional example in which the Ru layer is formed on the entire inner surface of the contact hole using an $SiO_2$ film as a plating mask to form the Pt plated layer in the contact hole, "the second dielectric element fabrication method" makes it possible to selectively deposit the plating onto the Ru layer provided on the substrate precisely in accordance with the mask pattern by using the photoresist layer, which can be removed by an oxygen plasma treatment, as an electroplating mask when the Pt electrode serving as the upper electrode is formed by the electroplating method. Thus, it is possible to solve the problem in the prior art that a coarse plated layer having voids or seams is likely to be obtained.

Moreover, the problem in the prior art that the contamination in the processing chamber occurs during removing a seed layer (base material) can be solved by using an Ru material whose oxide exhibits a conductivity and which can be easily removed by an oxygen plasma treatment, as the seed layer for forming the Pt plated layer.

Furthermore, in the "second dielectric element fabrication method", the upper electrode is provided on the dielectric layer not directly but via the Ru layer. In the prior art where the upper electrode is directly formed on the dielectric layer, a degradation in the dielectric characteristics occurs due to the reduction of the dielectric layer. According to the present invention, however, as the Pt layer (upper electrode) is deposited via the Ru layer over the dielectric layer, the aforementioned degradation phenomenon can be inhibited.

The Ru layer functions as an electrode material together with the Pt upper electrode, thereby making it possible to improve the electrical characteristics of the dielectric element.

The "third dielectric element" of the present invention is a dielectric element formed by sequentially depositing on a substrate an Ru layer, a Pt layer, a dielectric layer, an Ru layer, and a Pt layer.

In the third dielectric element, both of the lower electrode (Pt layer) and the upper electrode (Pt layer) are formed on the Ru layer. The third dielectric element has both advantages of the aforementioned first and second dielectric elements.

A high dielectric material such as STO or BST, or a ferroelectric material such as SBT or PZT can be preferably used as the dielectric layer, although materials for the dielectric layer are not limited thereto. The Bi-based ferroelectric same as that used in the "first dielectric element" is particularly preferable to use. The dielectric layer can be formed by using a known application method such as an LSMCD method, a spinner method, or a dip method.

The methods for forming the Ru layer and the Pt layer, and the like, may be the same as those described in the first and second dielectric elements.

The "third dielectric element fabrication method" of the present invention comprises:

(I) forming an Ru layer on a substrate;

(II) forming a photoresist layer on the Ru layer;

(III) selectively exposing the photoresist layer, and forming a photoresist pattern as a mask on the Ru layer;

(IV) forming a Pt layer, which is to be a lower electrode, on an exposed or unmasked area of the Ru layer by electroplating using a Pt plating solution utilizing the Ru layer as an electroplating electrode;

(V) removing the photoresist pattern and the Ru layer provided thereunder;

(VI) forming a dielectric layer on the Pt layer;

(VII) forming an Ru layer on the dielectric layer;

(VIII) forming a photoresist layer on the Ru layer;

(IX) selectively exposing the photoresist layer, and forming a photoresist pattern as a mask on the Ru layer;

(X) forming a Pt layer, which is to be an upper electrode, on an exposed or unmasked area of the Ru by electroplating using a Pt plating solution utilizing the Ru layer as an electroplating electrode; and (XI) removing the photoresist pattern and the Ru layer provided thereunder.

The third dielectric element fabrication method has the aforementioned advantages of the first and second dielectric element fabrication methods. Each step of the third dielectric element fabrication method can be performed in the same manner as in the corresponding step of the first or second dielectric element fabrication method.

It is desirable to perform a heat treatment after the formation of the upper electrode to improve the contact property (conductivity) between the Ru layer, which is the base layer, and the upper electrode.

According to each of the above-described elements and element fabrication methods of the present invention, even when at least one of the upper electrode and the lower electrode is a Pt electrode, and even in a micro element whose processing dimensions (width, line width, diameter, etc.) are on the order of 0.5 μm or less, it is possible to obtain a dielectric element having an excellent processability and excellent electrical characteristics without generating voids or seams.

The present invention will be described below in more detail with reference to the accompanying drawings by way of an example in which a Bi-based ferroelectric thin film is used as a dielectric layer. However, the present invention is not limited to such an example. The amount of each component is expressed by a percentage by weight unless indicated otherwise.

PREPARATION EXAMPLE

Preparation of a Coating Solution For Forming Bi-Based Ferroelectric Thin Film

A metal piece of Sr was added to a methoxyethanol ($CH_3OC_2H_4OH$) solution in a small amount at a time, and stirred, thereby preparing an Sr alkoxide solution (Sr $(OC_2H_4OCH_3)_2$).

$Bi(OC_2H_4OCH_3)_3$ and $Ta(OC_2H_5)_5$ were added to the Sr alkoxide solution, and subjected to a reflux process at a temperature of 80° C. for 20 hours, thereby preparing a coating solution for forming a Bi-based ferroelectric thin film which is a composite of Sr alkoxide, Bi alkoxide and Ta alkoxide.

EXAMPLE 1

As illustrated in FIG. 1, an Ru layer 3 with a thickness of 50 nm was formed by sputtering on a Si substrate 1 of a 6-inch diameter on which an $SiO_2$ film 2 having a thickness of 100 nm was provided.

Figure 2:
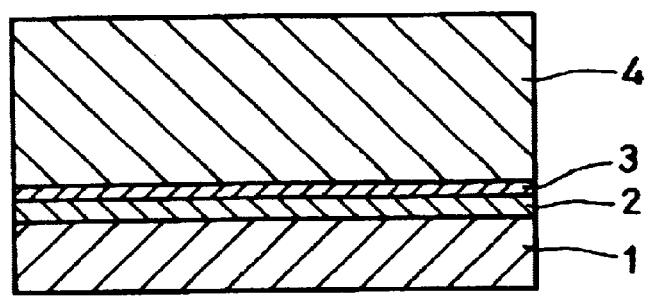
FIG. 2 is a schematic cross-sectional view illustrating a step in the method for fabricating a dielectric element according to the example of the present invention.

Then, as illustrated in FIG. 2, a photoresist layer 4 having a thickness of 800 nm was formed onto the surface of the Ru layer 3 entirely using i-line positive photoresist coating solution "TDMR-AR80" (product of Tokyo Ohka Kogyo Co., Ltd.). The photoresist layer 4 was selectively exposed through a mask (not shown) for an exposure time of 200 msec. As the exposure apparatus, the i-line stepper "NSR-2205i14E" (Nikon Corp.) was used.

Figure 3:
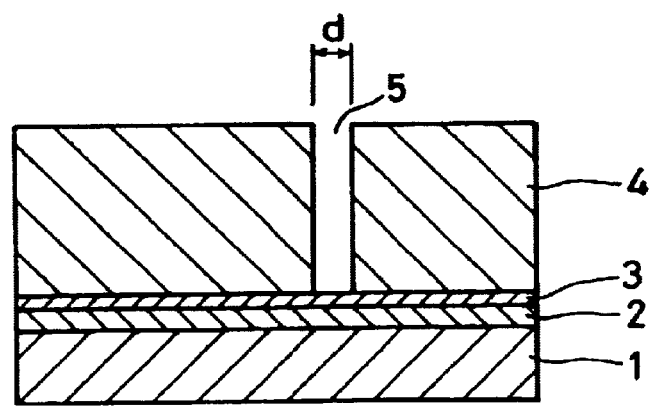
FIG. 3 is a schematic cross-sectional view illustrating a step in the method for fabricating a dielectric element according to the example of the present invention.
Figure 4:
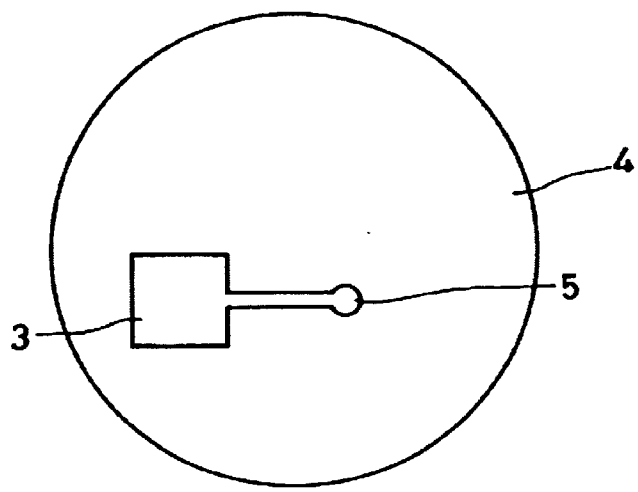
FIG. 4 is a plan view illustrating the step illustrated in FIG. 3.

After the exposure, a development process was performed using 2.38 wt % of tetramethylammonium hydroxide (TMAH) aqueous solution. Next, the photoresist layer 4 was washed with water, dried, and then subjected to a vacuum UV process and a hard bake process at a temperature of 180° C. for 3 minutes. As a result, a hole pattern 5 (FIG. 3) having a diameter of 0.5 μm (represented by "d" in FIG. 3) was formed on the Ru layer 3. The plan view illustrating the hole pattern is shown in FIG. 4.

Figure 5:
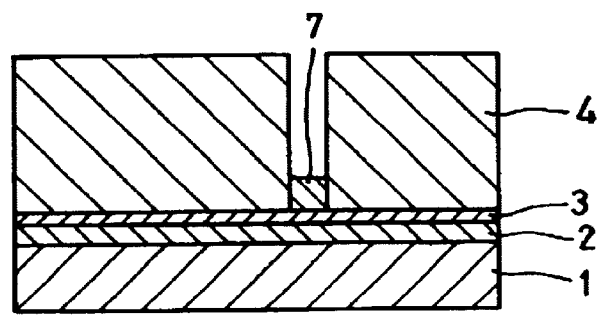
FIG. 5 is a schematic cross-sectional view illustrating a step in the method for fabricating a dielectric element according to the example of the present invention.

The surface of the substrate where the hole pattern 5 was formed was made in contact with "Platanex 3LS" (product of Electroplating Engineers of Japan Ltd.), which is an acid Pt plating solution, for 3 minutes at a current density of $1 \times 10^5$ A/m$^2$ and a Pt plating solution bath temperature of 80° C. The substrate was then washed with water and dried, and a Pt layer 7 with a thickness of 200 nm was selectively formed on an area of the Ru layer 3 which is not covered with the photoresist layer 4 (FIG. 5).

Figure 6:
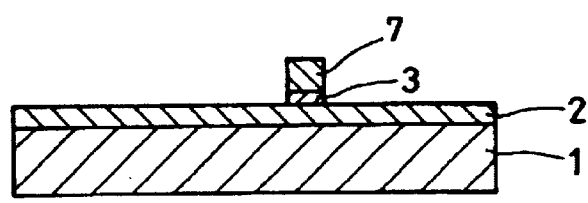
FIG. 6 is a schematic cross-sectional view illustrating a step in the method for fabricating a dielectric element according to the example of the present invention.

Next, the photoresist layer 4 and areas of the Ru layer 3 covered with the photoresist layer 4 were processed using a single wafer processing type ashing apparatus "TCA-4802" (product of Tokyo Ohka Kogyo Co., Ltd.) for 3 minutes under such conditions that the output frequency was 13.56 MHz; the output power was 1000 W; the oxygen flow rate was 30 sccm (flow rate of 30 cc/min.); the substrate stage temperature was 200° C.; and the pressure in the processing chamber was 60 mTorr, thereby removing the photoresist layer 4 and the portions of the Ru layer 3 from the substrate 1 (FIG. 6).

Thereafter, the surface of the substrate 1 was washed with a 10 wt % hydrochloric acid aqueous solution, and then washed with pure water. When the surface of the substrate 1 was observed using the SEM micrograph thereof, a physical damage to the $SiO_2$ film 2 was not found, and Ru residues were also not found.

In order to improve contact between the Ru layer 3 and the Pt layer 7, an annealing process was conducted thereto in the nitrogen atmosphere at a temperature of 600° C. for 30 minutes. Thereafter, using a spin coater, the coating solution for forming a Bi-based ferroelectric thin film prepared in the above-described preparation example was applied to the structure at 2000 rpm. The thusly obtained structure was dried for 30 minutes at a temperature of 150° C., and subjected to a heat treatment (first heat treatment) for 60 minutes at a temperature of 450° C. and then to a heat treatment (second heat treatment) for 60 minutes at a temperature of 750° C. in the oxygen atmosphere.

Figure 7:
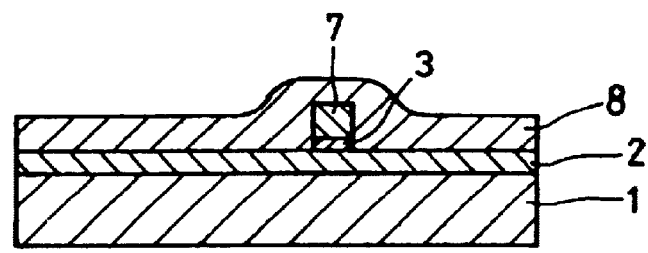
FIG. 7 is a schematic cross-sectional view illustrating a step in the method for fabricating a dielectric element according to the example of the present invention.

The series of steps from the application process to the second heat treatment were repeated four times, thereby forming a Bi-based ferroelectric thin film 8 having a thickness of 200 nm (FIG. 7).

Figure 8:
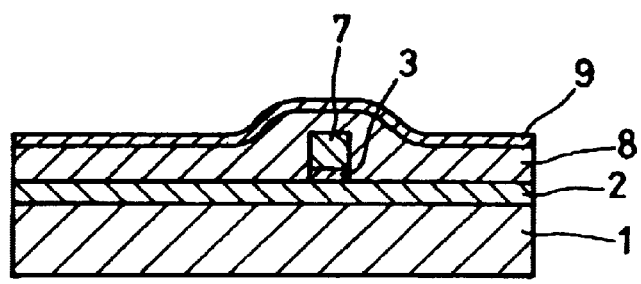
FIG. 8 is a schematic cross-sectional view illustrating a step in the method for fabricating a dielectric element according to the example of the present invention.

Next, an Ru layer 9 with a thickness of 50 nm was formed by a sputtering method on the substrate 1 on which the Bi-based ferroelectric thin film 8 was formed (FIG. 8).

A photoresist layer 10 having a thickness of 800 nm was formed on the entire surface of the Ru layer 9 using the aforementioned i-line positive photoresist coating solution. The photoresist layer 10 was selectively exposed through a mask (not shown) for an exposure time of 200 msec. The mask used herein was one having a mask pattern obtained by rotating the mask pattern by an angle of 90° of the mask that has been used in the previous process step.

Figure 9:
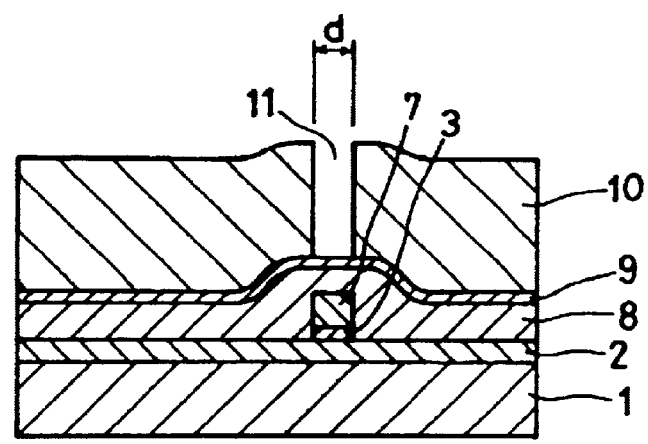
FIG. 9 is a schematic cross-sectional view illustrating a step in the method for fabricating a dielectric element according to the example of the present invention.
Figure 10:
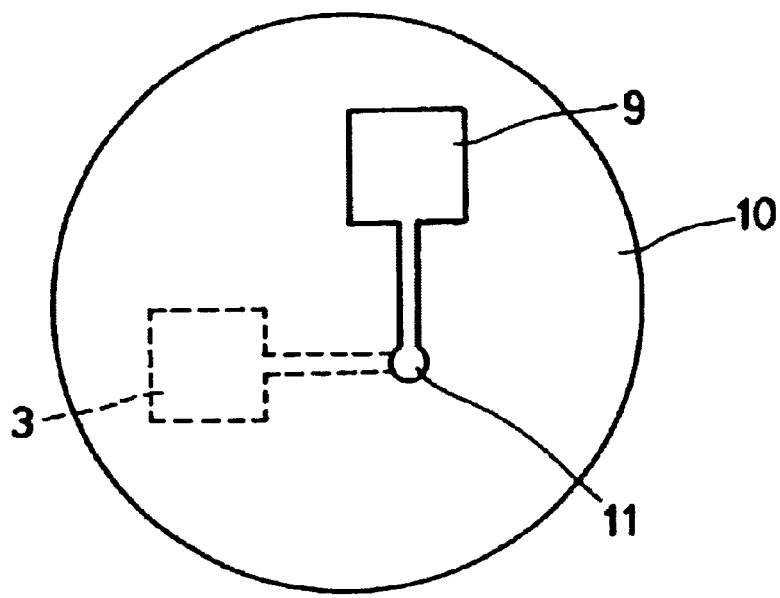
FIG. 10 is a plan view illustrating the step illustrated in FIG. 9.

After the exposure, a development process was performed using 2.38 wt % of TMAH aqueous solution. Next, the photoresist layer 10 was washed with water, dried, and then subjected to a vacuum UV process and a hard bake process at a temperature of 180° C. for 3 minutes. As a result, a hole pattern 11 (FIG. 9) having a diameter of 0.5 μm (represented by "d" in FIG. 9) was formed above the Ru layer 3. The plan view illustrating the hole pattern is shown in FIG. 10.

The surface of the substrate where the hole pattern 11 was formed was subjected to the electroplating process under the same conditions as those described above, thereby selectively forming a Pt layer 12 having a thickness of 200 nm on an area of the Ru layer 9 being not covered with the photoresist layer 10.

Next, the photoresist layer 10 and areas of the Ru layer 9 covered with the photoresist layer 10 were removed by ashing from the substrate in the same manner as that described above.

Thereafter, the substrate surface was washed with a 10 wt % hydrochloric acid aqueous solution, and then washed with pure water. Next, when the substrate surface was observed using the SEM micrograph thereof, a physical damage to the Bi-based ferroelectric thin film was not found, and Ru residues were also not found.

Figure 11:
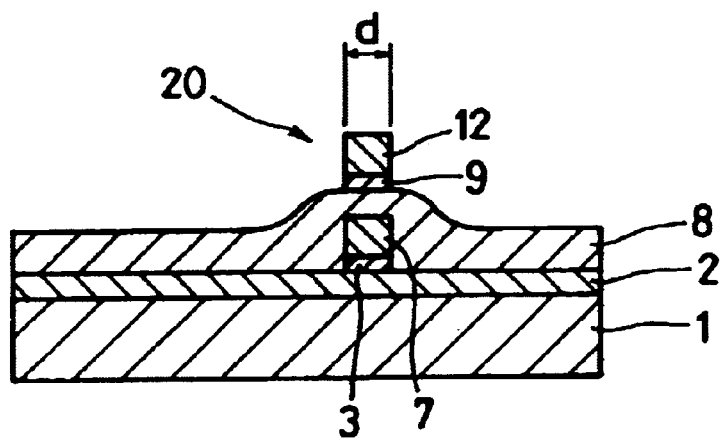
FIG. 11 is a schematic cross-sectional view illustrating a step in the method for fabricating a dielectric element according to the example of the present invention.

In order to improve contact between the Ru layer 9 and the Pt layer 12, an annealing process was conducted thereto in the nitrogen atmosphere at a temperature of 600° C. for 30 minutes, and thus, a dielectric element 20 (FIG. 11) was formed. The "d" (=0.5 μm) in FIG. 11 represents the width (processing dimension) of the dielectric element.

When the cross section of the dielectric element 20 was observed by the SEM micrograph thereof, it was confirmed that each of the lower and upper electrodes had a fine structure having no voids.

Figure 12:
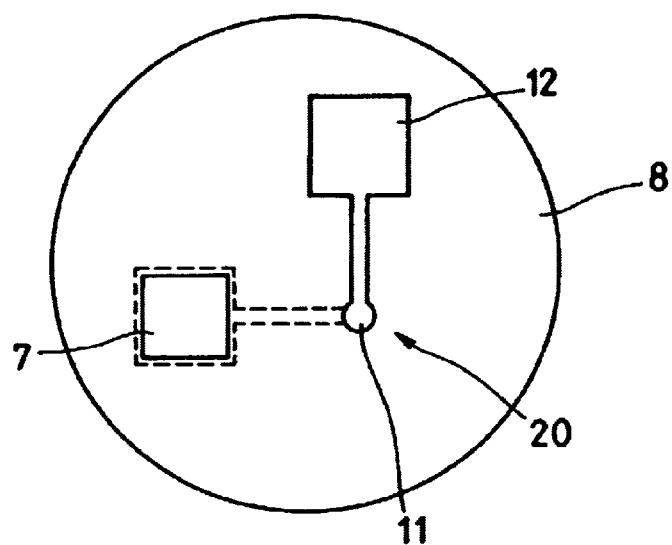
FIG. 12 is a plan view illustrating the dielectric element obtained in the example of the present invention.

In order to evaluate electrical characteristics of the thus-formed dielectric element 20, rubber-based negative photoresist "ORM-85II" (product of Tokyo Ohka Kogyo Co., Ltd.) was used to form a photoresist pattern on the Bi-based ferroelectric thin film 8. The Bi-based ferroelectric thin film on a Pt lower electrode pad corresponding to an electrical characteristics measurement terminal section (pad) was etched away using an etching liquid ($HNO_3$:HF:$H_2O$=7:3:40 (weight ratio)). Thereafter, the photoresist pattern was removed to expose the Pt lower electrode pad (dimension: length×width=50 μm×50 μm). The plan view illustrating such a state is shown in FIG. 12.

Figure 13:
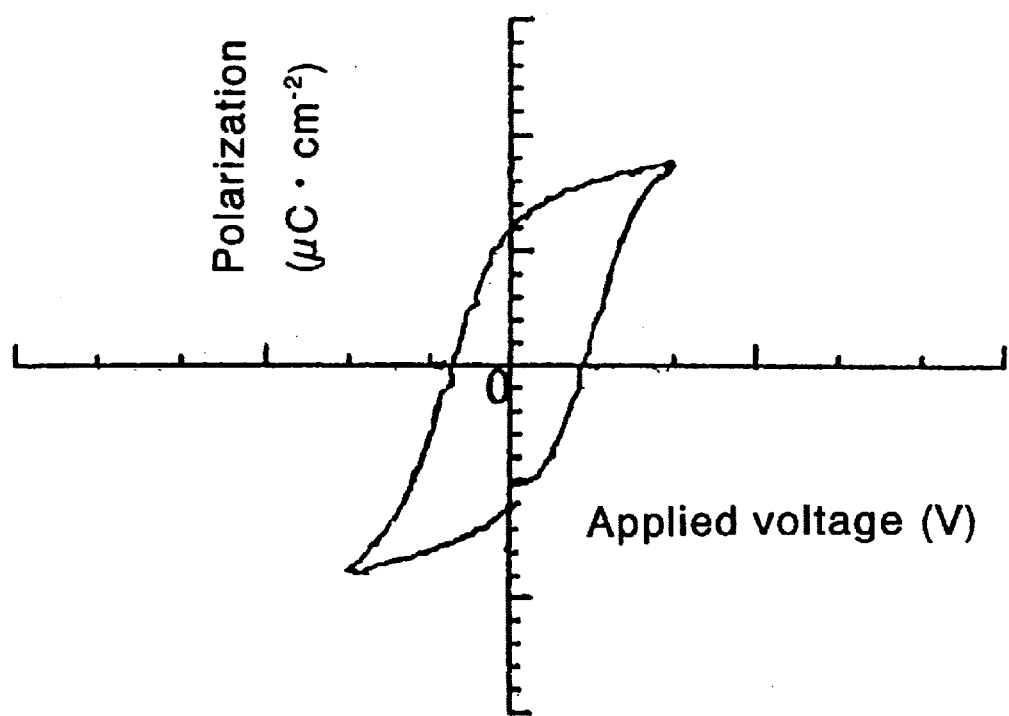
FIG. 13 is a graph showing a hysteresis curve of the dielectric element obtained in the example of the present invention.

After performing a heat treatment in the oxygen atmosphere at a temperature of 500° C. for 30 minutes, electrical circuits were formed in the Pt lower electrode pad and the Pt upper electrode pad. Next, polarization characteristics of the dielectric element were examined. As a result, a hysteresis curve shown in FIG. 13 was obtained, and the dielectric element had satisfactory polarization characteristics.

As described above in detail, according to the present invention, there are provided a dielectric element and a method for fabricating a dielectric element such that: it is possible to easily form a Pt electrode having excellent electrical characteristics without generating voids or seams; contamination in a processing chamber, or the like, does not occur; and it is possible to form a minute pattern.

What is claimed is:

1. A method for fabricating a dielectric element, comprising:
   (I) forming an Ru layer on a substrate;
   (II) forming a photoresist layer on the Ru layer;
   (III) selectively exposing the photoresist layer, and forming a photoresist pattern as a mask on the Ru layer;
   (IV) forming a Pt layer, which is to be a lower electrode, on an exposed or unmasked area of the Ru layer by electroplating using a Pt plating solution utilizing the Ru layer as an electroplating electrode;
   (V) removing the photoresist pattern and the Ru layer provided thereunder;
   (VI) forming a dielectric layer on the Pt layer; and
   (VII) forming a conductive layer, which is to be an upper electrode, on the dielectric layer.

2. The method for fabricating a dielectric element according to claim 1, wherein the conductive layer (upper electrode) in the step (VII) is a Pt layer.

3. The method for fabricating a dielectric element according to claim 2, wherein the Pt layer is formed by an electroplating method.

4. A method for fabricating a dielectric element, comprising:
   (I) forming a conductive layer, which is to be a lower electrode, on a substrate;
   (II) forming a dielectric layer on the conductive layer;
   (III) forming an Ru layer on the dielectric layer;
   (IV) forming a photoresist layer on the Ru layer;
   (V) selectively exposing the photoresist layer, and forming a photoresist pattern as a mask on the Ru layer;
   (VI) forming a Pt layer, which is to be an upper electrode, on an exposed or unmasked area of the Ru layer by electroplating using a Pt plating solution utilizing the Ru layer as an electroplating electrode; and
   (VII) removing the photoresist pattern and the Ru layer provided thereunder.

5. The method for fabricating a dielectric element according to claim 4, wherein the conductive layer (lower electrode) in the step (I) is a Pt layer.

6. The method for fabricating a dielectric element according to claim 5, wherein the Pt layer is formed by electroplating.

7. A method for fabricating a dielectric element, comprising:
   (I) forming an Ru layer on a substrate;
   (II) forming a photoresist layer on the Ru layer;
   (III) selectively exposing the photoresist layer, and forming a photoresist pattern as a mask on the Ru layer;
   (IV) forming a Pt layer, which is to be a lower electrode, on an exposed or unmasked area of the Ru layer by electroplating using a Pt plating solution utilizing the Ru layer as an electroplating electrode;
   (V) removing the photoresist pattern and the Ru layer provided thereunder;
   (VI) forming a dielectric layer on the Pt layer;
   (VII) forming an Ru layer on the dielectric layer;
   (VIII) forming a photoresist layer on the Ru layer;
   (IX) selectively exposing the photoresist layer, and forming a photoresist pattern as a mask on the Ru layer;
   (X) forming a Pt layer, which is to be an upper electrode, on an exposed or unmasked area of the Ru layer by electroplating using a Pt plating solution utilizing the Ru layer as an electroplating electrode; and
   (XI) removing the photoresist pattern and the Ru layer provided thereunder.

* * * * *